(12) United States Patent
Tsai et al.

(10) Patent No.: US 10,276,530 B2
(45) Date of Patent: Apr. 30, 2019

(54) LATERALLY EXTENDED CONDUCTIVE BUMP BUFFER

(71) Applicant: Taiwan Semiconductor Manufacturing Co., Ltd., Hsin-Chu (TW)

(72) Inventors: Yu-Hsiang Tsai, Hsin-Chu (TW); Hsin-Hung Chen, Hsin-Chu (TW); Chia-Ping Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/707,145

(22) Filed: Sep. 18, 2017

(65) Prior Publication Data
US 2019/0088610 A1 Mar. 21, 2019

(51) Int. Cl.
| | | |
|---|---|---|
| H01L 23/00 | (2006.01) |
| H01L 23/532 | (2006.01) |
| H01L 23/528 | (2006.01) |
| H01L 23/522 | (2006.01) |
| H01L 21/768 | (2006.01) |

(52) U.S. Cl.
CPC .............. *H01L 24/13* (2013.01); *H01L 24/03* (2013.01); *H01L 24/05* (2013.01); *H01L 24/11* (2013.01); *H01L 21/76843* (2013.01); *H01L 21/76879* (2013.01); *H01L 23/5226* (2013.01); *H01L 23/5283* (2013.01); *H01L 23/53266* (2013.01); *H01L 24/27* (2013.01); *H01L 24/32* (2013.01); *H01L 24/73* (2013.01); *H01L 2224/0391* (2013.01); *H01L 2224/0401* (2013.01); *H01L 2224/05016* (2013.01); *H01L 2224/05025* (2013.01); *H01L 2224/05073* (2013.01); *H01L 2224/05556* (2013.01); *H01L 2224/05573* (2013.01); *H01L 2224/05647* (2013.01); *H01L 2224/1145* (2013.01); *H01L 2224/11452* (2013.01); *H01L 2224/11614* (2013.01); *H01L 2224/11845* (2013.01); *H01L 2224/13007* (2013.01); *H01L 2224/13017* (2013.01); *H01L 2224/13021* (2013.01); *H01L 2224/13022* (2013.01); *H01L 2224/13155* (2013.01); *H01L 2224/13644* (2013.01); *H01L 2224/2762* (2013.01); *H01L 2224/27614* (2013.01); *H01L 2224/27831* (2013.01);
(Continued)

(58) Field of Classification Search
CPC ...... H01L 24/01–24/17; H01L 21/4825; H01L 2224/16111; H01L 2224/16112; H01L 2224/16013; H01L 2224/16014
See application file for complete search history.

(56) References Cited

U.S. PATENT DOCUMENTS 7,180,193 B2 * 2/2007 Liu .................... H01L 21/76802
257/751
2011/0278740 A1 * 11/2011 Chen ....................... H01L 24/81
257/777
(Continued)

*Primary Examiner* — Syed I Gheyas
(74) *Attorney, Agent, or Firm* — Duane Morris LLP

(57) ABSTRACT

A semiconductor device includes: a conductive structure, a conductive bump extending into the conductive structure and contacting the conductive structure along a first surface, the conductive bump configured to interface with an external semiconductor device at a second surface opposite the first surface, the conductive bump being wider along the first surface than the second surface.

20 Claims, 9 Drawing Sheets

(52) U.S. Cl.
CPC .............. *H01L 2224/73104* (2013.01); *H01L 2924/04941* (2013.01); *H01L 2924/20106* (2013.01)

(56) References Cited

U.S. PATENT DOCUMENTS

2015/0364436 A1* 12/2015 Yu ........................... H01L 24/11
                                                        438/614
2016/0126183 A1* 5/2016 Chen .................. H01L 23/5226
                                                        257/774

* cited by examiner

LATERALLY EXTENDED CONDUCTIVE BUMP BUFFER

BACKGROUND

The semiconductor industry has made significant advancements in its pursuit of higher device density with lower cost. Technological advances in semiconductor device, or integrated circuit (IC), materials and design have produced progressively smaller and more complex circuits. In the course of semiconductor device evolution, functional density (for example, the number of interconnected devices per chip area) has generally increased while geometry sizes have decreased. This scaling down process generally provides benefits by increasing production efficiency and lowering associated costs.

Semiconductor devices may include conductive materials such as copper, nickel, and gold to facilitate conductive interconnections. However, gold may be more reactive and change more readily in composition when exposed to copper, relative to other materials such as nickel. Also, copper may be more reactive and diffuse more readily, relative to other materials such as nickel. Therefore, nickel may be utilized between copper and gold as a buffer to prevent the diffusion of copper into gold.

However, increased functional density has increased the complexity of semiconductor devices, such as by decreasing the distance and amount of different conductive materials on a semiconductor device. This may result in undesirable diffusion and intermixing of different conductive materials, such as between copper and gold, as functional density increases and the distance between conductive materials decreases.

Accordingly, there may be a greater chance of failures per chip area during semiconductor processing. Therefore, conventional semiconductor device fabrication and processing are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
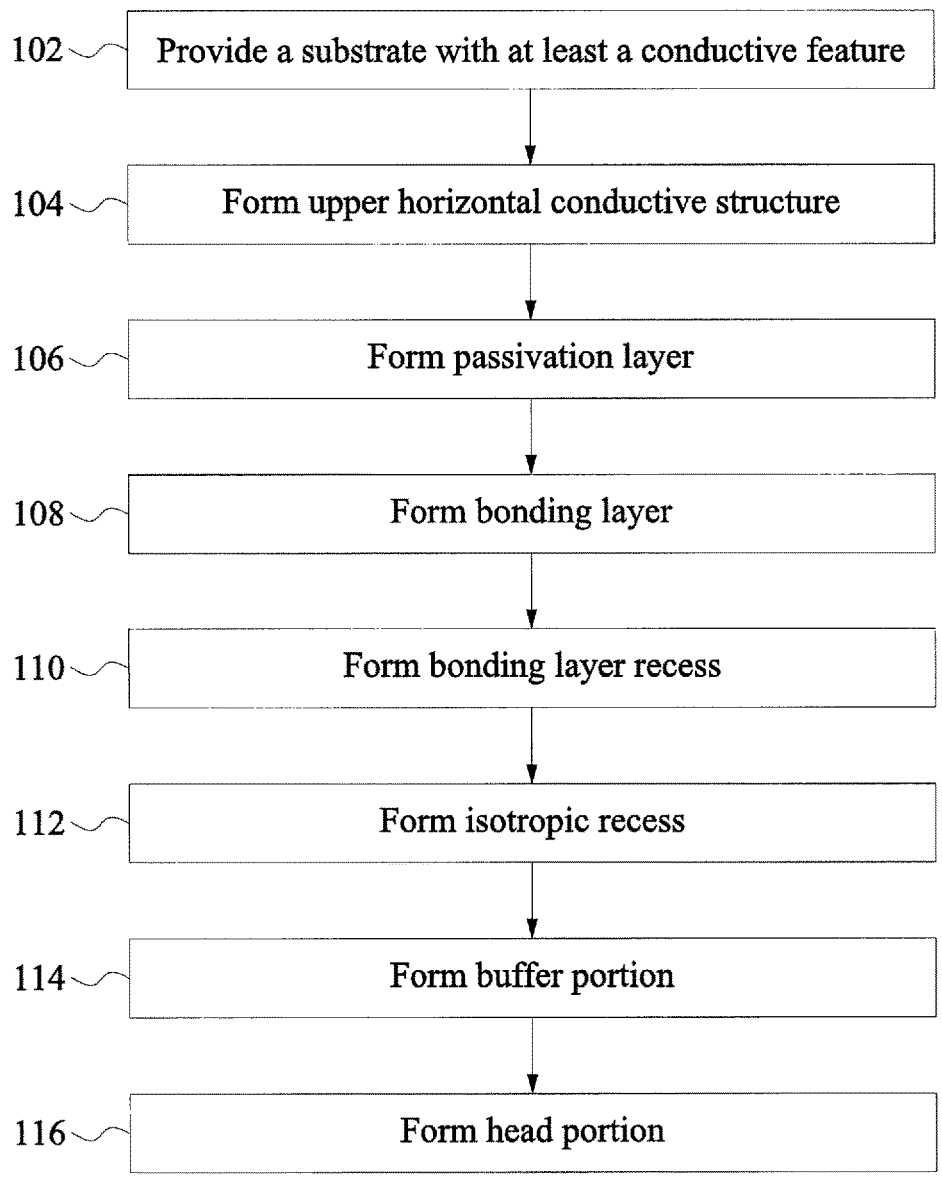
FIG. 1 illustrates a flow chart of an exemplary method for forming a semiconductor device including laterally extended conductive bump buffers, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device with a laterally extended conductive bump buffer (e.g., a laterally extended buffer portion of a conductive bump). As will be discussed further below, semiconductor devices may include bumps as interconnects used in semiconductor device packaging. For example, multiple semiconductor devices may be interconnected vertically using bumps as interconnects between each individual semiconductor devices, such as in a three dimensional integrated circuit (3DIC) or other semiconductor packaging schemes that exploit interconnections along a vertical direction. These bumps may be a type of conductive structure that extends the conductive reach of other conductive elements to extend vertically as a semiconductor device-to-semiconductor device interconnect.

As will be discussed further below, semiconductor devices may be formed, or processed, on a layer by layer basis, where each layer is deposited and patterned on a preceding layer. These layers (and at least one substrate on which the layers are formed) may include various conductive elements, such as conductive features (e.g., doped wells, voltage sources, or other active devices) that are interconnected via conductive structures (e.g., vias, or conductive lines). Stated another way, conductive elements include conductive features and conductive structures, and conductive features are active devices within a semiconductor device that may be interconnected using conductive structures. The conductive elements may include conductive material and the layers may include non-conductive material (e.g., insulating material) which may insulate conductive elements from each other via a dielectric barrier.

Conductive bumps may include different portions that are made of different conductive materials to achieve different conductive results. For example, a conductive bump may include a head portion, which is on top of and is bonded to a buffer portion. The buffer portion may be on top of and be bonded to an upper horizontal conductive structure (or, in other embodiments, any other type of conductive element) of a semiconductor device. The head portion may be the most outward extending part of the conductive bump and be configured to interconnect with other conductive bumps of other semiconductor devices (e.g., to interconnect with other head portions of the other conductive bumps). In certain embodiments, the head portion may be made of a conductive material such as gold that may have relatively good bond ability, good conductivity, low resistivity, and less sensitivity to oxidization relative to other conductive materials. The upper horizontal conductive structure may be made of a conductive material such as copper that may have good conductivity, low resistivity and that may be cheaper than other conductive materials (such as gold). As will be illustrated below, an upper horizontal conductive structure may be formed of a greater quantity of conductive material than the head portion. Therefore, minimizing use of more expensive materials (such as gold) for the upper horizontal conductive structure may be advantageous. The buffer portion may be sandwiched between the upper horizontal conductive structure and the head portion and include a relatively less reactive conductive material, such as nickel, to serve as a buffer between the head portion and the upper horizontal conductive structure. For example, as mentioned above, copper and gold may be more reactive materials than nickel. Specifically, copper may be a relatively more reactive material as it may diffuse into and through spaces and materials at a greater rate than other materials, such as gold or nickel. Also, gold may be a relatively more reactive material as it may more easily change (e.g., change faster or with less exposure) in composition if exposed to a diffusive material, such as copper (relative to other materials, such as nickel, which do not as easily change in composition when exposed to other diffusive materials). Accordingly, copper (of the upper horizontal conductive structure) that diffuses into gold (of the head portion) may change and adulterate the gold, making the gold less pure and reducing the head portion's bond ability and conductivity and increase the head portion's resistivity and sensitivity to oxidization.

In certain embodiments, the buffer portion may be enhanced by laterally extending the buffer portion into the upper horizontal conductive structure, such that the buffer portion is partially surrounded by the upper horizontal conductive structure on more than one side (as opposed to being formed on the upper horizontal conductive structure and contacting the upper horizontal conductive structure at only one side of the buffer portion). By laterally extending the buffer portion into the upper horizontal conductive structure, the material of the upper horizontal conductive structure (also termed as upper horizontal conductive structure material) may not have a direct line of diffusion to the material of the head portion (also termed as head material) along the sidewalls of the buffer portion. As will be discussed further below, the sidewalls of the buffer portion may not have complete adherence between materials along the sidewalls, such that a space between materials along the sidewalls may be formed along the sidewalls of the buffer portion. Also, by laterally extending the buffer portion into the upper horizontal conductive structure, the upper horizontal conductive structure material may be further distanced from the head material. For example, with a laterally extended buffer portion, the upper horizontal conductive structure material may be further distanced from the head material along the sidewalls of the buffer portion. Also, with a laterally extended buffer portion, the upper horizontal conductive structure material may be further distanced from the head material across the amount of material of the buffer portion (also termed as buffer material) that the upper horizontal conductive structure material may diffuse across to reach the head material. The buffer portion may be laterally extended by isotopically etching the upper horizontal conductive structure such that the buffer portion may be formed (by depositing buffer material) in the isotropic recess (e.g., recess formed by isotropic etching). An isotropic recess may be formed by isotropic etching that is non directional (etching both vertically and horizontally), in contrast with anisotropic recesses formed by anisotropic etching or directional etching (etching vertically but not horizontally). As the buffer portion is formed in an isotropic recess, there would be no direct line of diffusion for the upper horizontal conductive structure material, in contrast with an anisotropic recess with a direct line of diffusion along the straight sidewalls of the anisotropic recess. In certain embodiments, isotropic etching may be accomplished using wet etching while isotropic etching may be accomplished using dry etching. In various embodiments, the buffer portion may be formed in a recess made with both anisotropic and isotropic etching, such that the sidewalls of the buffer portion include both vertical and horizontal parts (with more acute turns, corners, or edges) to further obfuscate direct lines of material diffusion.

Optionally, in particular embodiments, spacers may be formed along the sidewalls of the buffer portion to fill in any spaces at the sidewalls due to incomplete adherence between materials along the sidewalls, as discussed above. The spacers may be formed as a deposit of a barrier material (discussed further below) such as titanium nitride (TiN) along the sidewalls of the buffer portion.

FIG. 1 illustrates a flowchart of a method 100 to form a semiconductor device with a laterally extended buffer portion of a conductive bump (e.g., a laterally extended conductive bump buffer portion) according to one or more embodiments of the present disclosure. It is noted that the method 100 is merely an example, and is not intended to limit the present disclosure. Accordingly, it is understood that additional operations may be provided before, during, and after the method 100 of FIG. 1, certain operations may be omitted, and some other operations may only be briefly described herein.

In some embodiments, operations of the method 100 may be associated with the cross-sectional views of a semiconductor device at various fabrication stages as shown in FIGS. 2A, 2B, 2C, 2D, 2E, 2F, 2G, and 2H respectively, which will be discussed in further detail below.

Referring now to FIG. 1, the method 100 starts with operation 102 in which a semiconductor substrate with at least a conductive feature is provided. The method 100 continues to operation 104 where a upper horizontal conductive structure is formed on the semiconductor device, in conductive communication with the conductive feature. The method 100 continues to operation 106 where a passivation layer is formed overlaying the upper horizontal conductive structure. The method 100 continues to operation 108 where a bonding layer is formed overlaying the passivation layer. The method 100 continues to operation 110 where a bonding layer recess is formed through the bonding layer. The method 100 continues to operation 112 where an isotropic recess is formed that extends into the upper horizontal conductive structure. The method 100 continues to operation 114 where a buffer portion of the conductive bump is formed in the isotropic recess. The method 100 continues to operation 116 where a head portion is formed over the buffer portion and in the bonding layer recess.

As mentioned above, FIG. 2A through FIG. 2H illustrate, in a cross-sectional views, respective portions of a semiconductor device 200 at various fabrication stages of the method 100 of FIG. 1. The semiconductor device 200 may include, be included in, or be a microprocessor, memory cell, wafer, and/or other integrated circuit (IC). Also, FIGS. 2A through 2H are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2H, for purposes of clarity of illustration.

Figure 2A:
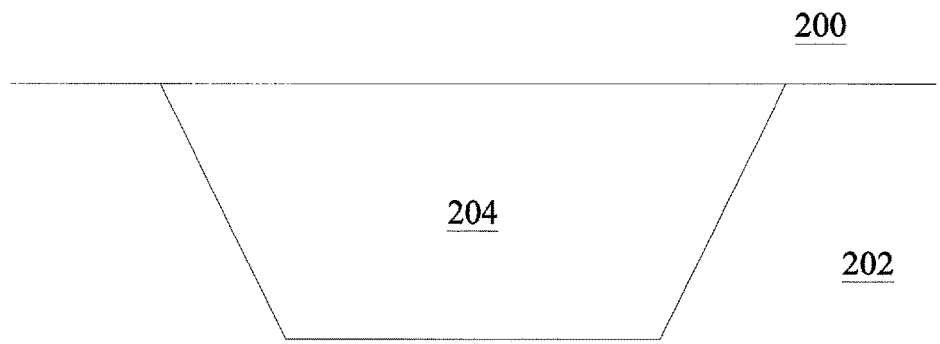
FIGS. 2A, 2B, 2C, 2D, 2E, 2F, 2G, and 2H illustrate cross-sectional views of an exemplary semiconductor device during various fabrication stages, made by the method of FIG. 1, in accordance with some embodiments.

FIG. 2A is a cross-sectional view of the semiconductor device 200 including a substrate 202 with at least one conductive feature 204 at one of the various stages of fabrication corresponding to operation 102 of FIG. 1, in accordance with some embodiments. Although the semiconductor device 200 in the illustrated embodiment of FIG. 2A includes only one conductive feature (e.g., 204), it is understood that the illustrated embodiment of FIG. 2A and the following figures are merely provided for illustration purposes. Thus, the semiconductor device 200 may include any desired number of conductive features 204 while remaining within the scope of the present disclosure.

In some embodiments, the substrate 202 includes a silicon substrate. Alternatively, the substrate 202 may include other elementary semiconductor materials such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various conductive features, such as p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various active devices (or integrated circuit (IC) devices), such as a complimentary metal-oxide-semiconductor field-effect transistor (CMOSFET), imaging sensor, and/or light emitting diode (LED). The substrate 202 may further include other conductive features, or active devices (functional features) such as a resistor or a capacitor formed in and on the substrate. The substrate 202 further includes lateral isolation features provided to separate various conductive features or devices formed in the substrate 202. In one embodiment, shallow trench isolation (STI) features are used for lateral isolation. The various devices further include silicide disposed on S/D, gate and other device features for reduced contact resistance when coupled to output and input signals.

In an embodiment, the conductive feature 204 may be a source, drain or gate electrode of transistor device. Alternatively, the conductive feature 204 may be a silicide feature disposed on a source, drain or gate electrode. The silicide feature may be formed by a self-aligned silicide (typically known as "silicide") technique. In another embodiment, the conductive feature 204 may include an electrode of a capacitor or one end of a resistor.

Figure 2B:
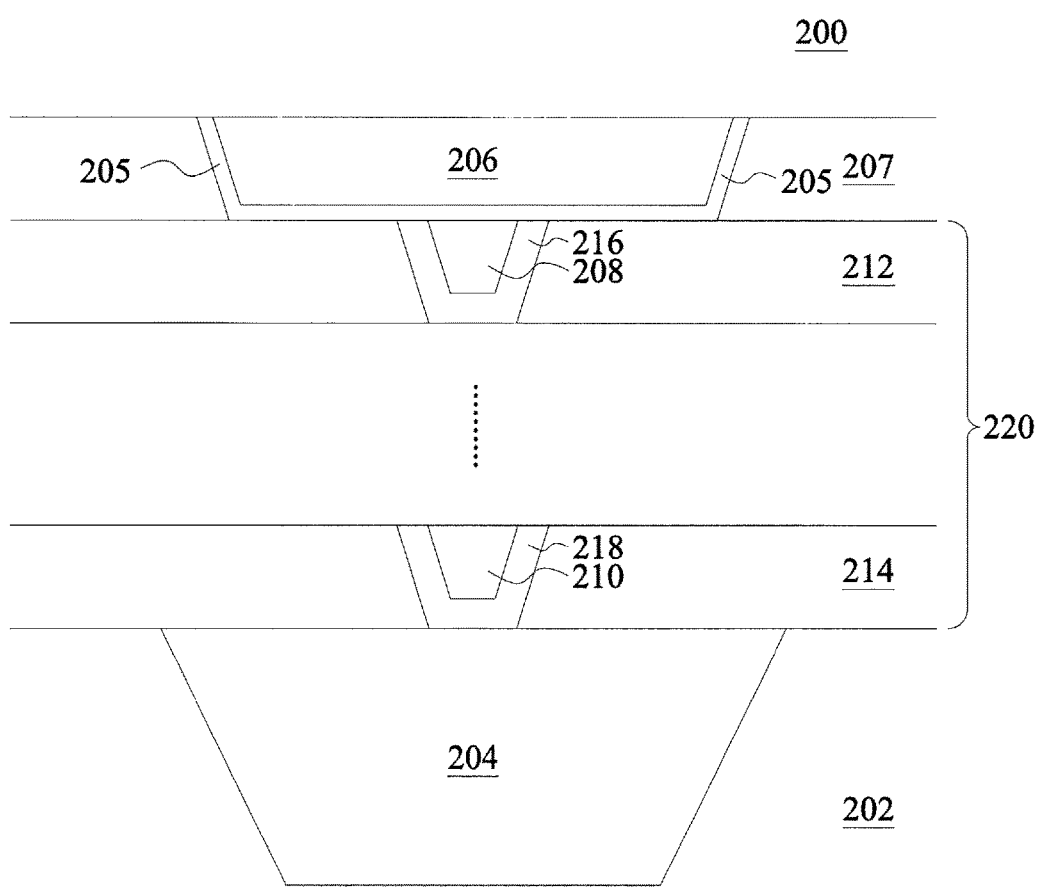

FIG. 2B is a cross-sectional view of the semiconductor device 200 including a barrier layer 205 surrounding sidewalls and bottom surfaces of an upper horizontal conductive structure 206 at one of the various stages of fabrication that corresponds to operation 104 of FIG. 1, in accordance with some embodiments. The barrier layer 205 and upper horizontal conductive structure 206 may be formed within an upper isolation layer 207. Also, the barrier layer and upper horizontal conductive structure 206 may be formed on top of intermediate conductive structures 208, 210. As introduced above, conductive structures may be interconnects for conductive features (active devices in the semiconductor device). Also, both conductive structures and conductive features may be generally referred to herein as conductive elements. The intermediate conductive structures may include vertical conductive structure(s) 208, 210 (e.g., vias) and horizontal conductive structure(s) (e.g., conductive lines, not illustrated). For clarity, these intermediate conductive structures are described as "intermediate" because they are disposed between (and facilitate a conductive path between) the conductive feature 204 and the upper horizontal conductive structure 206, as discussed in further detail below. Also, for clarity, the upper horizontal conductive structure 206 and upper isolation layer 207 are described as "upper" because they are on top of the intermediate conductive structures, as discussed in further detail below.

The intermediate vertical conductive structures 208, 210 may vertically extend through respective isolation layers 212, 214 to couple with other conductive elements, such as the upper horizontal conductive structure 206, conductive feature 204 or intermediate horizontal conductive structures (not illustrated). Intermediate conductive structures may include horizontal conductive structures that may horizontally extend (e.g., over a respective width) through an isolation layer to couple with other conductive elements, such as intermediate vertical conductive structures 208, 210. However, the intermediate conductive structures are not illustrated for simplicity of illustration. In some embodiments, horizontal conductive structures (e.g., upper horizontal conductive structure 206) may be wider (e.g., possess a larger cross sectional area) than the intermediate vertical conductive structures 208, 210. In certain embodiments, the intermediate vertical conductive structure 210 adjacent to the conductive feature 204 may be a conductive plug. In some further embodiments, the semiconductor device 200 may include barrier layers 216, 218 surrounding respective sidewalls and bottom surfaces of the intermediate conductive structures 208, 210 similar to how barrier layer 205 surrounds respective sidewalls and bottom surfaces of upper horizontal conductive structure 206. Barrier layers 205, 216, 218 will be discussed in further detail below.

Although the semiconductor device 200 in the illustrated embodiment of FIG. 2B includes two intermediate conductive structures 208, 210 within two isolation layers 212, 214, it is understood that the illustrated embodiment of FIG. 2B and the following figures are merely provided for illustration purposes. Thus, the semiconductor device 200 may include any desired number and type of conductive structures within any desired number of isolation layers while remaining within the scope of the present disclosure (as noted with the ellipses between the isolation layers 212, 214).

Isolation layers 207, 212, 214 may also be termed as dielectric layers. The isolation layers 207, 212, 214 may form a non-conductive (e.g., dielectric) separation, or isolation, between conductive elements within the semiconductor device. The isolation layers 207, 212, 214 may include a non-conductive material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the conductive structures 206, 208, 210 may include conductive materials, such as a metal, or for example, copper (Cu), tungsten (W), or a combination thereof. In some other embodiments, the conductive structures 206, 208, 210 may include other suitable conductive materials (e.g., metal materials such as gold (Au), cobalt (Co), silver (Ag), Nickle (Ni), etc. and/or conductive materials (e.g., polysilicon)) while remaining within the scope of the present disclosure.

In some embodiments, the barrier layers 205, 216, 218 may include barrier materials that enhance (e.g., improves) conductivity of conductive materials and may effectively prevent (e.g., block) metal atoms from diffusing from conductive materials into non-conductive materials during a deposition process to form conductive structures or conductive features. Examples of barrier materials include tantalum nitride (TaN), tantalum (Ta), titanium nitride (TiN), titanium (Ti), cobalt tungsten (CoW), tungsten nitride (WN), or the like.

In the following discussion, reference to conductive structures 206, 208, 210 may or may not include their corresponding barrier layers 205, 216, 218 as part of the respective conductive structure 206, 208, 210. In various embodiments, the barrier layer does not change the function of its respective adjoining conductive structure except to enhance the material properties of the adjoining conductive structures.

The intermediate vertical conductive structures 208, 210 may each be formed respectively by at least some of the following process steps: using chemical vapor deposition (CVD), physical vapor deposition (PVD), spin-on coating, and/or other suitable techniques to deposit over (e.g., respectively over the substrate 202 and the conductive feature 204 or over an isolation layer and a vertical or horizontal conductive feature (not illustrated)) the non-conductive material to form an initial first isolation layer (the isolation layer is a remaining portion of the initial first isolation layer after the later performed patterning process); performing one or more patterning processes (e.g., a lithography process, a dry/wet etching process, a cleaning process, a soft/hard baking process, etc.) to form an opening through the initial first isolation layer; using CVD, PVD, and/or other suitable techniques to deposit the aforementioned barrier material along a bottom surface and sidewalls of the opening to surround the opening; using CVD, PVD, E-gun, and/or other suitable techniques to fill the opening with conductive material, and polishing out excessive material to form the intermediate vertical conductive structures 208, 210.

In addition to vertical conductive structures 208, 210, the intermediate isolation layers 220 may include intermediate horizontal conductive structure(s) (not illustrated) that horizontally extends over a respective width in an isolation layer among the intermediate isolation layers 220. For example, the intermediate horizontal conductive structure(s) may be conductively coupled to the intermediate vertical conductive structures 208, 210.

The upper horizontal conductive structure 206 may be formed on, and be in conductive communication with, the vertical conductive structure 208 or any other conductive structure from the intermediate isolation layers 220. In certain embodiments, the upper horizontal conductive structure 206 may be formed within the isolation layer 207. In these embodiments, the upper horizontal conductive structure 206 (and horizontal conductive structures generally) may be formed by at least some of the following process steps: using CVD, PVD, spin-on coating, and/or other suitable techniques to deposit non-conductive material over an underlying layer and underlying conductive structure to form an initial first isolation layer (the upper horizontal conductive structure 206 is within an isolation layer (e.g., isolation layer 207) that is a remaining portion of this initial first isolation layer after the later performed patterning process); performing one or more patterning processes (e.g., a lithography process, a dry/wet etching process, a cleaning process, a soft/hard baking process, etc.) to form an opening through the initial first isolation layer; using CVD, PVD, and/or other suitable techniques to deposit the aforementioned barrier material along a bottom surface and sidewalls of the opening to surround the opening; using CVD, PVD, E-gun, and/or other suitable techniques to fill the opening with conductive material, and polishing out excessive material to form the upper horizontal conductive structure 206.

Figure 2C:
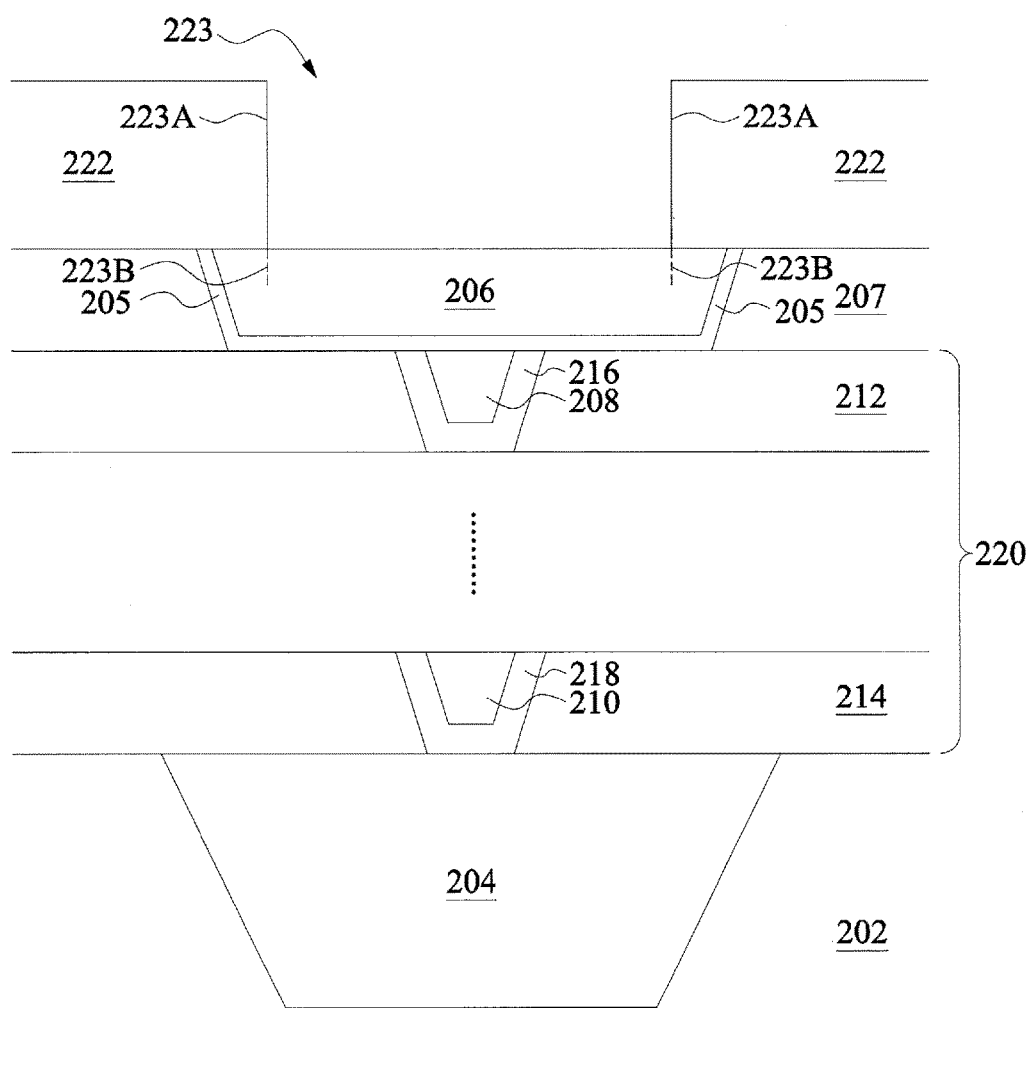

FIG. 2C is a cross-sectional view of the semiconductor device 200 including a passivation layer 222 at one of the various stages of fabrication that corresponds to operation 106 of FIG. 1, in accordance with some embodiments. As illustrated the passivation layer 222 is formed on the upper isolation layer 207 and the upper horizontal conductive structure 206. In various embodiments, the passivation layer 222 may be formed using CVD, PVD, E-gun, and/or other suitable techniques to deposit passivation material (discussed below) on the upper horizontal conductive structure 206. There may be a spacing 223 between parts of the passivation layer 222. This spacing 223 may be located above part of the upper horizontal conductive structure 206 and may be filled by bonding material (discussed below) to facilitate formation of a bump (also discussed below) that extends through the bonding material. In certain embodiments, the spacing 223 may be formed by depositing the passivation layer 222 over the isolation layer 207 in places aside from the spacing 223. In other embodiments, the spacing 223 may be formed by patterning the passivation layer 222 at the location of the spacing 223 (e.g., performing a lithography process, a dry/wet etching process, a cleaning process, a soft/hard baking process, etc. to form the spacing 223 through the passivation layer 222). The spacing 223 may include spacing sidewalls 223A that demarcate the spacing relative to the passivation layer 222. Also, the spacing sidewalls 223A may be vertically projected as a vertical projection 223B of spacing sidewalls 223A (indicated with dotted lines), as will be discussed further below in connection with FIG. 2F.

The passivation layer 222 may be a protective layer or coating formed on a semiconductor device 200 to protect the semiconductor device 200 during handing or packaging. The passivation layer 222 may protect the semiconductor device 200 from various stressors, such as compression, moisture, heat, shear forces, damaging mediums (e.g., damaging chemicals or gases) or any other externally inducible damage to a semiconductor device 200.

In particular embodiments, the passivation layer 222 may be composed of passivation materials that protect the semiconductor device 200 from external stressors. These passivation materials may include silicon mononitride (SiN), dielectric materials, oxides (such as Un-doped Silicate Glass USG, Fluorinated Silicate Glass FSG, or the like) or other materials that may suitably protect a semiconductor device 200 from external stresses. These materials may be selected based upon the desired qualities of the passivation layer 222. For example, SiN may be a passivation material for a passivation layer that is moisture resistant and USG may be a passivation material for a passivation layer that is pressure resistant. In the illustrated embodiment, the passivation layer may be SiN.

Figure 2D:
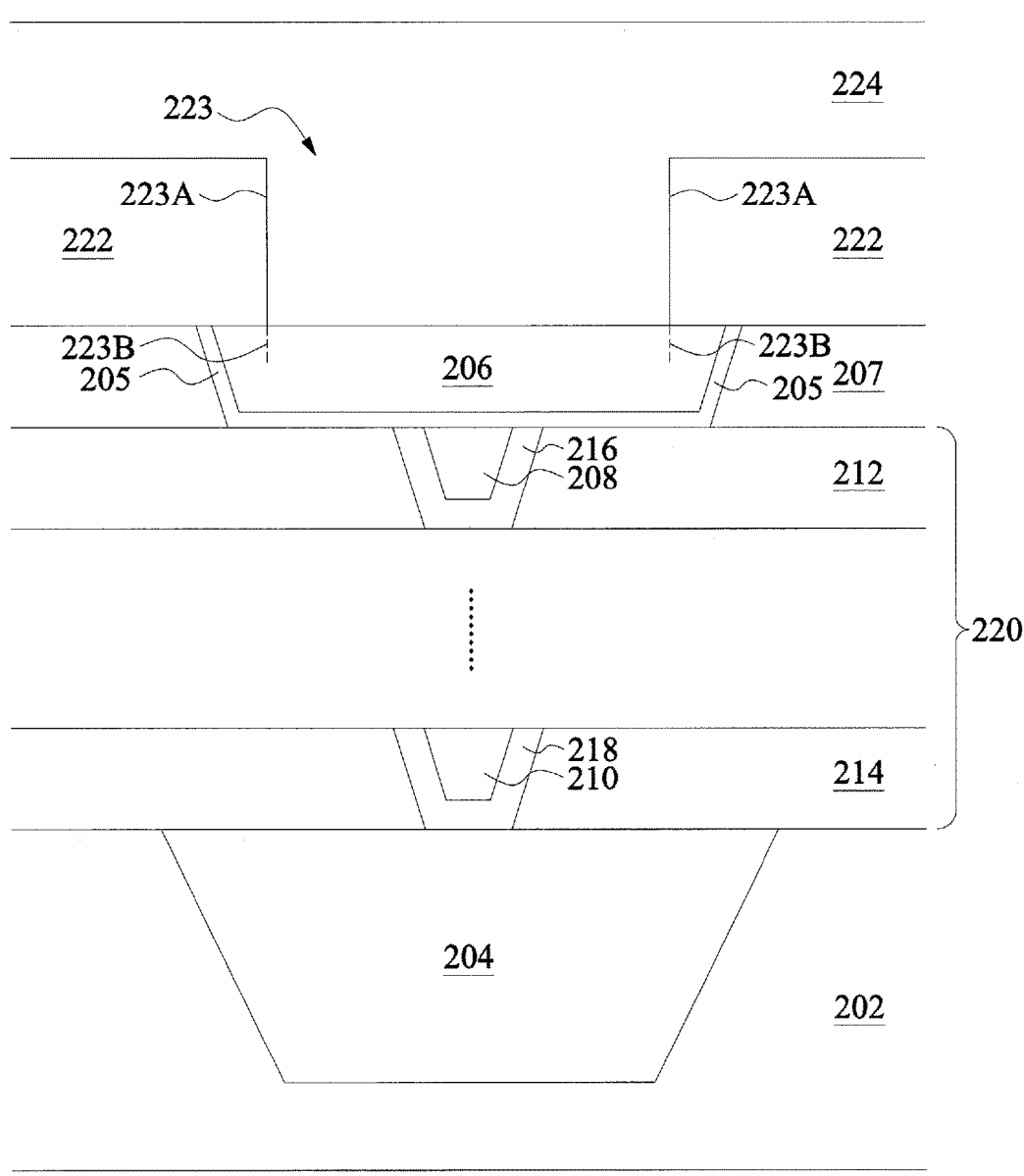

FIG. 2D is a cross-sectional view of the semiconductor device 200 including a bonding layer 224 at one of the various stages of fabrication that corresponds to operation 108 of FIG. 1, in accordance with some embodiments. As illustrated the bonding layer 224 is formed on the upper horizontal conductive structure 206 and the passivation layer 222. In various embodiments, the bonding layer 224 may be formed using CVD, PVD, E-gun, and/or other suitable techniques to deposit bonding material (discussed below) on the upper horizontal conductive structure 206 and the passivation layer 222.

In certain embodiments, the bonding layer 224 may be less resistive to etching than the passivation layer 222. The bonding layer 224 may be deposited into (and overlay) the spacing 223 in the passivation layer 222. Accordingly, the bonding layer 224 within the spacing 223 may be etched (e.g., patterned) and filled with conductive material to form a conductive bump, as will be discussed in further detail below at least in reference to FIG. 2H.

The bonding layer 224 may be a layer of bonding material to assist in bonding between semiconductor devices during semiconductor device packaging (e.g., during 3DIC processing). For example, the bonding material may provide a planar surface for the semiconductor device 200 along which the head portion (discussed below) may be exposed to facilitate a semiconductor device-to-semiconductor device interconnection. Also, the bonding material may be more adhesive to other bonding material when put in contact with the other bonding material to facilitate semiconductor packaging. These bonding materials may include an oxide, such as silicon oxide, silicon nitride or the like.

Figure 2E:
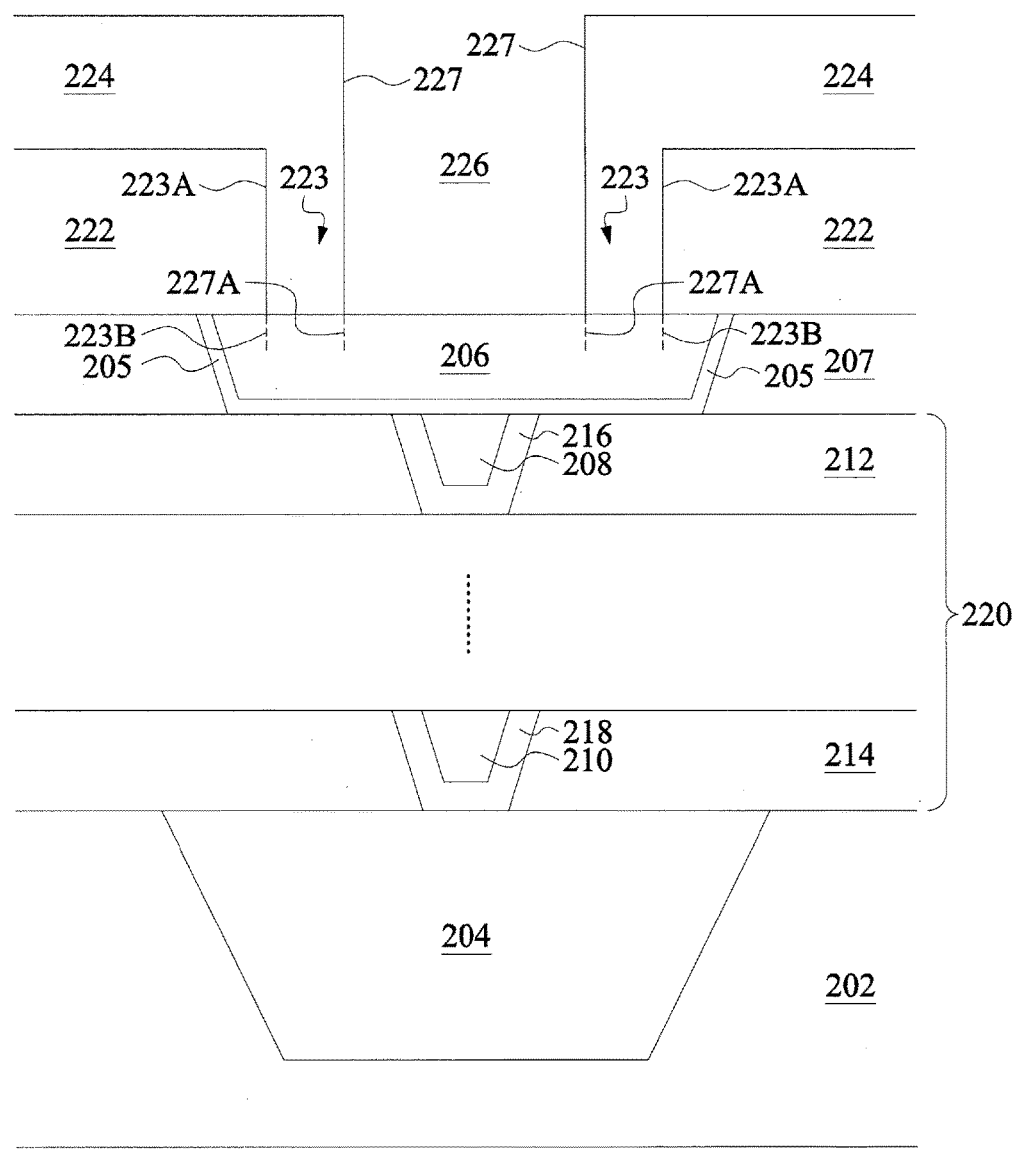

FIG. 2E is a cross-sectional view of the semiconductor device 200 including a bonding layer recess 226 extending vertically through the bonding layer 224 to expose the upper horizontal conductive structure 206 at one of the various stages of fabrication that corresponds to operation 110 of FIG. 1, in accordance with some embodiments. Specifically, the bonding layer recess 226 exposes a portion of the top surface of the upper horizontal conductive structure 206. Also, the bonding layer recess 226 may include vertically extending sidewalls 227 that demarcate the bonding layer recess 226. As will be discussed in connection with FIG. 2F, the vertical sidewalls 227 may be vertically projected as a vertical projection 227A (noted with dotted lines) of the vertical sidewall 227 of the bonding layer recess 226.

In some embodiments, the bonding layer recess 226 may be formed by using a photoresist as a mask to perform one or more dry/wet etching processes to respectively or simultaneously etch the bonding layer 224 to reach the upper horizontal conductive structure 206. More specifically, in the embodiments in which the bonding layer includes silicon oxide as the bonding material, the wet etching process to etch the bonding layer 224 may be performed by using hydrofluoric acid or the like; and/or the dry etching process to etch the bonding layer 224 may be performed by using etchant gases, for example, tetrafluoroethylene ($CF_4$), fluoroform ($CHF_3$), difluoromethane ($CH_2F_2$), octafluorocyclobutane ($C_4F_8$), argon (Ar), and/or oxygen ($O_2$).

Figure 2F:
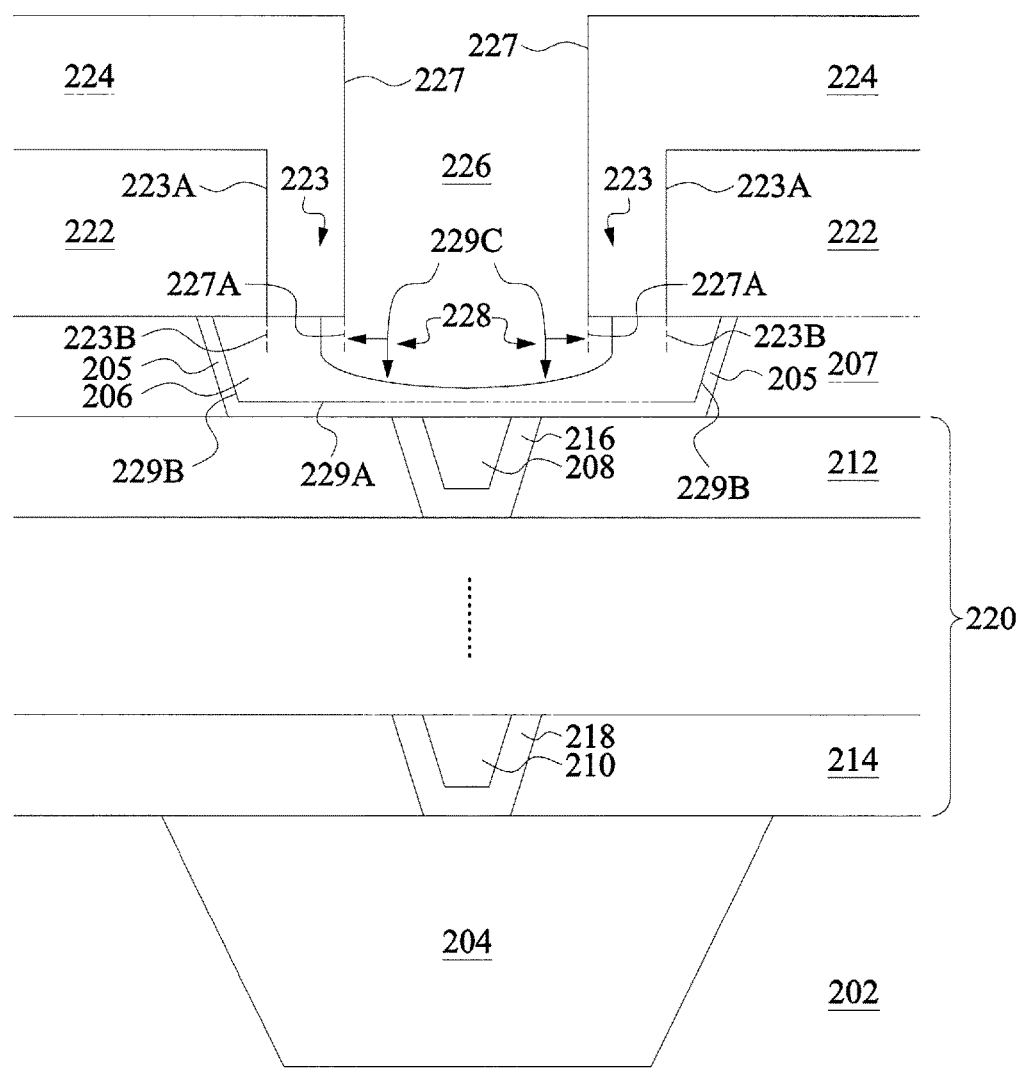

FIG. 2F is a cross-sectional view of the semiconductor device 200 including an isotropic recess 228 in the upper horizontal conductive structure 206 at one of the various stages of fabrication that corresponds to operation 110 of FIG. 1, in accordance with some embodiments. The isotropic recess 228 extends into an upper portion of the upper horizontal conductive structure 206. Specifically, the isotropic recess 228 extends vertically toward a bottom 229A of the upper horizontal conductive structure and laterally toward sidewalls 229B of the upper horizontal conductive structure 206. For example, the isotropic recess 228 may extend laterally (e.g., toward sidewalls 229B) beyond a vertical projection 227A (noted with dotted lines) of the sidewall 227 of the bonding layer recess 226. In further embodiments, the isotropic recess 228 may extend further laterally (e.g., toward sidewalls 229B) beyond the vertical projection 223B of the spacing sidewalls 223A. Accordingly, the isotropic recess 228 is wider (e.g., has greater lateral extension) than the bonding layer recess 226.

In some embodiments, the isotropic recess 228 may be formed by using a photoresist as a mask to perform one or more isotropic etching processes 229C (e.g., wet etching), as indicated with vertical and horizontal arrows 229C, to etch the upper horizontal conductive structure 206 exposed by the bonding layer recess 226. More specifically, in the embodiments in which the upper horizontal conductive structure 206 includes copper, the isotropic wet etching process to etch the upper horizontal conductive structure 206 may be performed by using SPS15 acid or the like.

In certain embodiments, a geometric dimension of the isotropic recess 228 may be controlled by varying one or more processing conditions of the isotropic etching process 229C. For example, the isotropic recess 228 may be larger in width and depth (e.g., extending more vertically and horizontally/laterally) as the isotropic etching process 229C is applied for a greater time. Also, the isotropic etching process 229C may be controlled such that the isotropic recess 228 is substantially wider than the bonding layer recess 226 to frustrate inter layer metal cross diffusion (e.g., diffusion of copper from the upper horizontal conductive structure 206 to gold at the head portion 232) by making the sidewalls of the conductive bump (discussed below), and/or the sidewalls of the combined bonding layer recess and isotropic recess, nonlinear (e.g., not straight, or with curves, edges, corners, or angles). Also, the isotropic etching process 229C may be controlled to increase the lateral extension of the isotropic recess (e.g., to make the isotropic recess wider than the bonding layer recess) to increase a separation distance along the sidewalls of the combined bonding layer recess and isotropic recess between the upper horizontal conductive structure material (e.g., copper) and the head portion material (e.g., gold), as will be discussed further below. Also, the isotropic etching process 229C may be controlled to avoid over etching such that too much of the upper horizontal conductive structure 206 is etched away, deleteriously reducing the amount of contact (and according conductivity) between the upper horizontal conductive structure material and buffer material, which will be filled into the isotropic recess 228, as will be discussed further below.

Figure 2G:
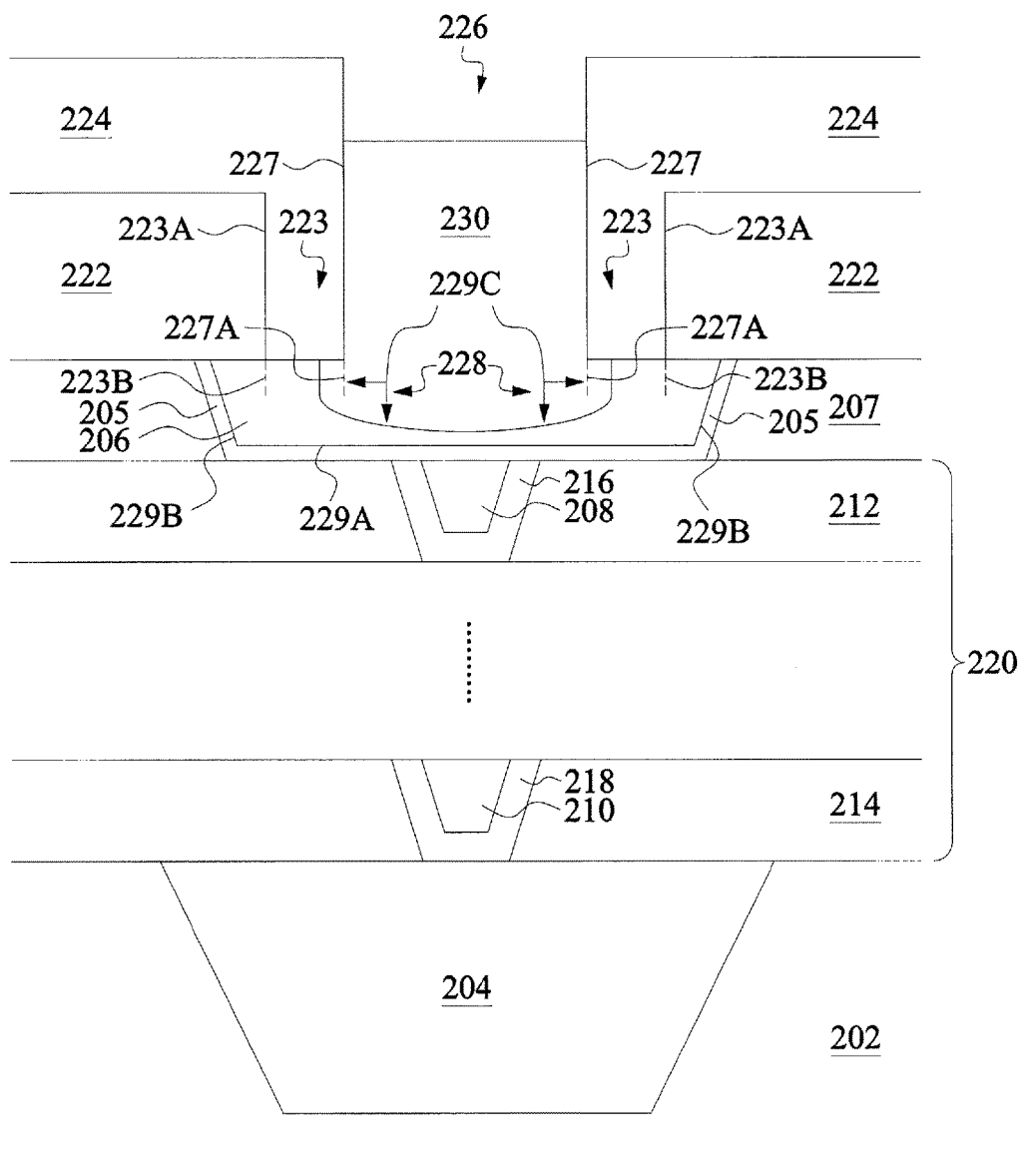

FIG. 2G is a cross-sectional view of the semiconductor device 200 including a buffer portion 230 of the conductive bump at one of the various stages of fabrication that corresponds to operation 114 of FIG. 1, in accordance with some embodiments. The buffer portion 230 may be formed as a deposition (e.g., using CVD, PVD, E-gun, and/or other suitable depositing techniques) of buffer material into the isotropic recess 228 and part of the bonding layer recess 226.

The buffer material may be any type of conductive material that is less reactive than conductive materials adjoining the buffer material, such that the buffer material may maintain a conductive connection between the adjoining conductive materials but also be a buffer against the adjoining conductive materials reacting with each other. For example, the buffer material may be nickel, which may adjoin (and separate) conductive materials such as gold and copper. The nickel buffer material may not be substantially reactive (e.g., may not substantially transform into another material or diffuse into another material). However, the adjoining conductive materials may be more reactive than the nickel buffer material, such as where gold may be sensitive to copper and react with copper to form another material (e.g., a gold-copper alloy) or where copper may be highly diffusive and tend to diffuse into other materials, such as gold (but have less of a tendency to diffuse into the nickel buffer material). Other examples of buffer materials may include titanium and the like.

The isotropic recess 228 and a lower portion of the bonding layer recess 226 may be refilled with the buffer material to form the buffer portion 230 of the conductive bump. In some embodiments, the buffer portion 230 may be in conductive communication with the conductive feature 204 through the upper horizontal conductive structure 206 and/or the intermediate conductive structures 208 and 210.

Figure 2H:
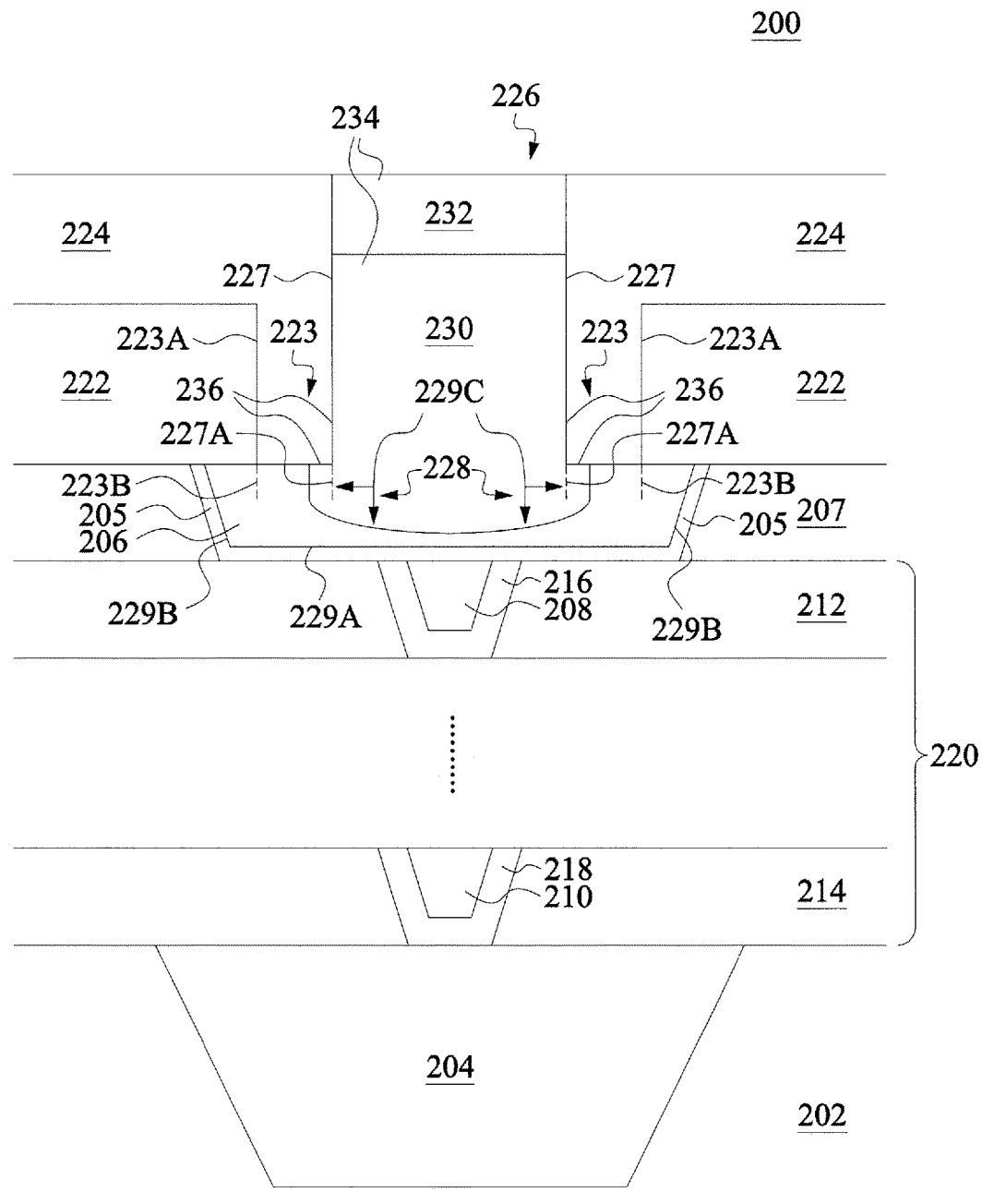

FIG. 2H is a cross-sectional view of the semiconductor device 200 including a head portion 232 of the conductive bump 234 at one of the various stages of fabrication that corresponds to operation 116 of FIG. 1, in accordance with some embodiments. In some embodiments, after the formation of the head portion 232, the conductive bump 234 may be formed as the combination of the head portion 232 and the buffer portion 230. The head portion 232 refills an upper portion (i.e., a remaining portion) of the bonding layer recess 226. In some embodiments, the head portion 232 may be formed by depositing (e.g., using CVD, PVD, E-gun, and/or other suitable depositing techniques) a head material into the upper portion of the bonding layer recess 226. More specifically, the head material is deposited in the bonding layer recess 226 of the bonding layer 224, and a polishing process (e.g., a chemical-mechanical polishing (CMP) process) is performed to polish out excessive head material so as to cause a top surface of the head portion 232 (also a top surface of the conductive bump 234) to be aligned with a top surface of the bonding layer 224.

In certain embodiments, the head material may be a conductive material such as gold that may have relatively good bond ability, good conductivity, low resistivity, and/or less sensitivity to oxidization relative to other conductive materials (such as copper or nickel). Other examples of head materials may include solder and the like.

As mentioned above, the bonding layer recess 226 may be filled with the head material to form the head portion 232 of the conductive bump 234. In some embodiments, the head portion 232 may be in conductive communication with the conductive feature 204 through the buffer portion 230, upper horizontal conductive structure 206, and the intermediate conductive structures 208, 210.

As discussed above, the conductive bump 234 may include different portions that are made of different conductive materials to achieve different conductive results. For example, the conductive bump 234 includes the head portion 232, which is on top of and is bonded to the buffer portion 230. The buffer portion 230 may be on top of and be bonded to the upper horizontal conductive structure 206 of the semiconductor device 200. The head portion 232 may be the most outward extending part of the conductive bump 234 and be configured to interconnect with other conductive bumps of other semiconductor devices (e.g., to interconnect with other head portions of the other conductive bumps).

For example, the buffer portion 230 may be sandwiched between the upper horizontal conductive structure 206 and the head portion 232 and include a relatively less reactive conductive material (e.g., the buffer material introduced above), such as nickel, to serve as a buffer between the relatively more reactive materials that may constitute the head portion 232 and/or the upper horizontal conductive structure 206. For example, as discussed above, copper and gold may be more reactive materials than nickel. Specifically, copper may be a relatively more reactive material as it may diffuse into and through spaces and materials at a greater rate than other materials, such as gold or nickel. Also, gold may be a relatively more reactive material as it may transform more readily when exposed with diffusive materials, such as copper (when compared with nickel). Accordingly, copper upper horizontal conductive structure material (of the upper horizontal conductive structure 206) that diffuses into gold head material (of the head portion 232) may change and adulterate the gold head material (of the head portion 232). This may make the gold head material less pure and reduce the head portion's bond ability and conductivity and increase the head portion's resistivity and sensitivity to oxidization.

However, the buffer portion 230 may be enhanced by laterally extending the buffer portion 230 into the upper horizontal conductive structure 206 (producing a laterally extended conductive bump buffer 230 or laterally extended buffer portion 230), such that the buffer portion 230 is partially surrounded by the upper horizontal conductive structure 206 on more than one side (as opposed to being formed on the upper horizontal conductive structure 206 and contacting the upper horizontal conductive structure 206 at only one side of the buffer portion 230). By laterally extending the buffer portion 230 into the upper horizontal conductive structure 206, the material of the upper horizontal conductive structure 206 (also termed as upper horizontal conductive structure material, discussed above) may not have a direct line of diffusion to the material of the head portion 232 (also termed as head material, discussed above) along the sidewalls 236 of the buffer portion 230.

Also, by laterally extending the buffer portion 230 into the upper horizontal conductive structure 206, the upper horizontal conductive structure material may be further distanced from the head material. For example, the upper horizontal conductive structure material may be further distanced from the head material along the sidewalls 236 of the buffer portion 230 and across the amount of material of the buffer portion 230 (also termed as buffer material, discussed above) that the upper horizontal conductive structure material may diffuse across to reach the head material.

As discussed above, the buffer portion 230 may be laterally extended by isotopically etching the upper horizontal conductive structure 206 such that the buffer portion 230 may be formed (by depositing buffer material) in the isotropic recess 228 (e.g., recess formed by isotropic etching 229C, or an isotropic etching process 229C). An isotropic recess 228 may be formed by isotropic etching 229C that is non directional (etching both vertically and horizontally), in contrast with anisotropic recesses formed by anisotropic etching or directional etching (etching vertically but not horizontally). As the buffer portion 230 is formed in the isotropic recess 228, there would be no direct line of diffusion for the upper horizontal conductive structure material, in contrast with an anisotropic recess. As discussed above, an anisotropic recess may be a recess formed by anisotropic etching, such as the bonding layer recess 226 (discussed above in connection with FIG. 2E) with a direct line of diffusion along the straight sidewalls of the anisotropic recess. Returning to FIG. 2H, in various embodiments, the buffer portion 230 may be formed in a recess made with both anisotropic and isotropic etching 229C, such as the illustrated embodiment where the buffer portion 230 is formed in a recess made with anisotropic etching (e.g., the bonding layer recess 226) and isotropic etching 229C (e.g., the isotropic recess 228). Accordingly, the sidewalls 236 of the buffer portion 230 may include both vertical and horizontal parts to further obfuscate direct lines of material diffusion.

Figure 3:
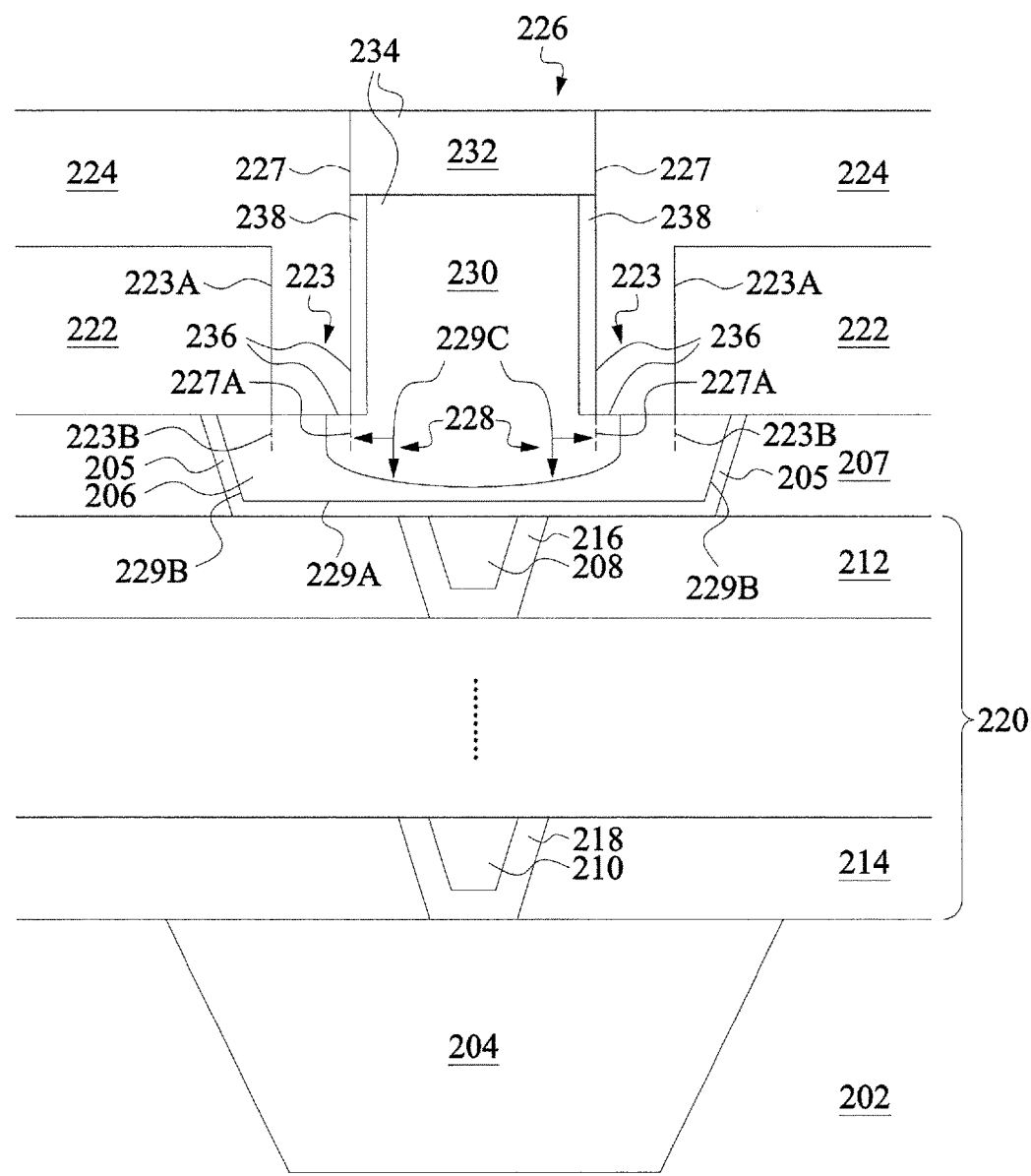
FIG. 3 illustrate a cross-sectional view of an exemplary laterally extended conductive bump buffer with sidewall spacers, in accordance with some embodiments.

FIG. 3 illustrates a cross-sectional view of an exemplary laterally extended conductive bump buffer 230 of FIG. 2H, but with sidewall spacers 238, in accordance with some embodiments. FIG. 3 illustrates an alternate and optional embodiment to FIG. 2H where spacers 238 are formed along the portion of the sidewalls 236. The spacers 238 may be formed along the portion of the sidewalls 236 formed with the bonding layer recess 226, as discussed above in connection with FIG. 2E.

As discussed above, during semiconductor processing, the sidewalls 236 of the buffer portion 230 may not have complete adherence between materials along the sidewalls 236, such that a space between materials along the sidewalls 236 may be formed along the sidewalls 236 of the buffer portion 230. Accordingly a spacer may be formed that comprises the barrier material (discussed above), that may fill in the space between materials along the sidewalls 236. For example, the spacers 238 may be formed as a deposit of titanium nitride (TiN) barrier material along the sidewalls of the buffer portion 230.

In certain embodiments, the spacer 238 may be formed after first forming the buffer portion 230 in the isotropic recess 228 as a deposition (e.g., using CVD, PVD, E-gun, and/or other suitable depositing techniques) of buffer material into the isotropic recess 228 (as also discussed in connection with FIG. 2G). Then the spacers 238 may be formed as a deposition (e.g., using CVD, PVD, and/or other suitable techniques) of the aforementioned barrier material onto the sidewalls 236 along the bonding layer recess 226 (to the level that the buffer material is to be filled into). Optionally, the barrier material may be removed from the bottom of the bonding layer recess 226 (over at least part of the earlier deposited buffer material into the isotropic recess 228) by etching using a mask or other suitable means of barrier layer material removal. Then the remaining buffer material may be deposited into the bonding layer recess 226 to form the buffer portion 230. Also, as discussed above in connection with FIG. 2H, the remainder of the bonding layer recess 226 may be filled with the head material to form the head portion 232.

In an embodiment, a semiconductor device includes: a conductive structure, a conductive bump extending into the conductive structure and contacting the conductive structure along a first surface, the conductive bump configured to interface with an external semiconductor device at a second surface opposite the first surface, the conductive bump being wider along the first surface than the second surface.

In another embodiment, a semiconductor device includes: a horizontal conductive structure; a layer overlaying the horizontal conductive structure; and a conductive bump extending through the layer, the conductive bump comprising: a head portion, and a buffer portion adjoining the head portion, the buffer portion being wider when further from the head portion, the buffer portion extending into the horizontal conductive structure.

Yet in another embodiment, a method includes: forming a conductive structure; forming a first layer over the conductive structure; faulting an anisotropic recess in the first layer; forming an isotropic recess in the conductive structure beneath the anisotropic recess; filling the isotropic recess with a buffer material; and filling the anisotropic recess with a head material.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor device, comprising:
a conductive structure; and
a conductive bump extending into the conductive structure and contacting the conductive structure with a buffer material along a first surface, the conductive bump with a head material configured to interface with an external semiconductor device at a second surface opposite the first surface, the conductive bump being wider along the first surface with the buffer material contacting and laterally surrounded by the conductive structure than along the second surface with the head material, wherein the head material is different than the buffer material.

2. The semiconductor device of claim 1, wherein the conductive bump extends into the conductive structure along an isotropic recess that extends into the conductive structure.

3. The semiconductor device of claim 2, wherein the conductive bump is formed in an anisotropic recess formed using anisotropic etching.

4. The semiconductor device of claim 1, wherein the conductive bump comprises nickel at the first surface and gold at the second surface.

5. The semiconductor device of claim 4, wherein the conductive structure comprises copper.

6. The semiconductor device of claim 1, wherein the conductive bump comprises sidewalls that are nonlinear.

7. The semiconductor device of claim 1, wherein the conductive bump comprises sidewalls that include a corner.

8. A semiconductor device, comprising:
a horizontal conductive structure;
a layer overlaying the horizontal conductive structure; and
a conductive bump extending through the layer, the conductive bump comprising:
a head material, and
a buffer material adjoining the head material, the buffer material extending into and laterally surrounded by the horizontal conductive structure at a width greater than the head material, wherein the head material is different than the buffer material.

9. The semiconductor device of claim 8, wherein the buffer material extends laterally and vertically into the horizontal conductive structure.

10. The semiconductor device of claim 8, wherein the buffer material is less reactive than the head material or a horizontal conductive structure material of the horizontal conductive structure.

11. The semiconductor device of claim 8, wherein the buffer material comprises nickel, the head material comprises gold, and the horizontal conductive structure comprises copper.

12. The semiconductor device of claim 8, wherein the buffer material is formed in an isotropic recess etched into the horizontal conductive structure.

13. The semiconductor device of claim 8, comprising a spacer between the buffer material and the layer.

14. The semiconductor device of claim 13, wherein the spacer comprises titanium nitride (TiN).

15. The semiconductor device of claim 13, wherein the spacer comprises a barrier material that improves conductivity of a conductive material contacting the spacer while blocking diffusion of metal across the spacer.

16. The semiconductor device of claim 8, wherein the conductive bump is configured to interact with an external conductive bump of an external semiconductor device.

17. The semiconductor device of claim 8, wherein the semiconductor device is part of a three dimensional integrated circuit.

18. A method comprising:
forming a conductive structure;
forming a first layer over the conductive structure;
forming an anisotropic recess in the first layer;
forming an isotropic recess in the conductive structure beneath the anisotropic recess;
filling the isotropic recess with a buffer material; and
filling the anisotropic recess with a head material.

19. The method of claim 18, wherein the head material and the buffer material are conductive materials, wherein the buffer material is less reactive than the head material.

20. The method of claim 18, wherein the isotropic recess comprises sidewalls that are nonlinear.

* * * * *